(12) United States Patent
Lugauer et al.

(10) Patent No.: US 6,927,155 B2
(45) Date of Patent: Aug. 9, 2005

(54) PROCESS FOR PRODUCING SEMICONDUCTOR LAYERS BASED ON III-V NITRIDE SEMICONDUCTORS

(75) Inventors: Hans-Juergen Lugauer, Sinzing (DE); Stefan Bader, Eilsbrunn (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/488,379

(22) PCT Filed: Sep. 2, 2002

(86) PCT No.: PCT/DE02/03221

§ 371 (c)(1),
(2), (4) Date: Aug. 23, 2004

(87) PCT Pub. No.: WO03/025988

PCT Pub. Date: Mar. 27, 2003

(65) Prior Publication Data

US 2004/0266157 A1 Dec. 30, 2004

(30) Foreign Application Priority Data

Aug. 31, 2001 (DE) .......................................... 101 42 656

(51) Int. Cl.$^7$ ...................... H01L 21/28; H01L 21/3205
(52) U.S. Cl. ........................ 438/604; 438/603; 438/933
(58) Field of Search ................................ 438/604, 603, 438/933, 606, 607, 680, 681, 752, 753, 931

(56) References Cited

U.S. PATENT DOCUMENTS 6,153,010 A * 11/2000 Kiyoku et al. ................. 117/95
6,261,929 B1 * 7/2001 Gehrke et al. ............... 438/478
6,844,251 B2 * 1/2005 Shenai et al. ................ 438/571

FOREIGN PATENT DOCUMENTS

| EP | 0 874 405 A2 | 3/1998 |
| EP | 0 942 459 A1 | 4/1998 |
| EP | 1 111 663 | 6/2001 |
| WO | WO 00 55893 A | 9/2000 |
| WO | WO 01 27980 A | 4/2001 |

* cited by examiner

*Primary Examiner*—David Nhu
(74) *Attorney, Agent, or Firm*—Cohen, Pontani, Lieberman & Pavane

(57) ABSTRACT

In the process for producing low-defect semiconductor layers based on III-V nitride semiconductor material, a substrate (1) made from a material which is not based on III-V nitride semiconductors is provided, and then a mask layer (2) is applied to the substrate in order to form unmasked regions (2c) and masked regions (2a, 2b) on the substrate. Then, starting from the unmasked regions (2c) of the substrate (1), the III-V nitride semiconductor layer (3) is grown. To avoid the formation of stress-induced cracks during the cooling phase from the growth temperature to room temperature, the mask layer (2) is formed on the substrate (1) in such a manner that some of the masked regions (2b) are wide enough to prevent the III-V nitride semiconductor layer (3) from growing together over these wide masked regions (2b), whereas the III-V nitride semiconductor layer does grow together only over the other, narrow masked regions (2a).

13 Claims, 1 Drawing Sheet

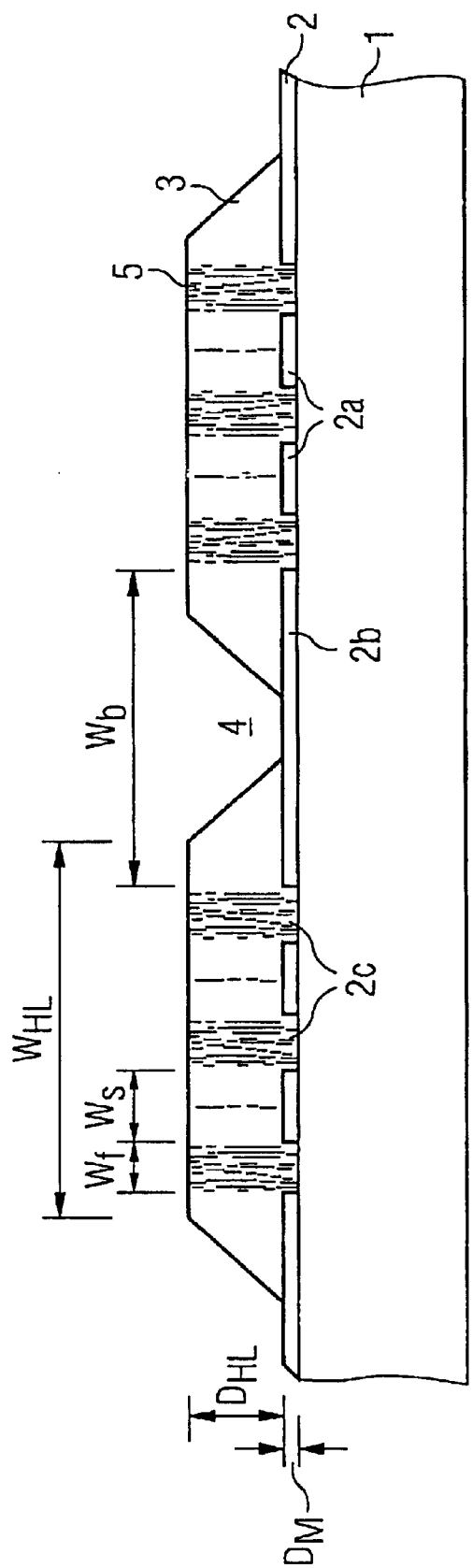

PROCESS FOR PRODUCING SEMICONDUCTOR LAYERS BASED ON III-V NITRIDE SEMICONDUCTORS

This is a U.S. national stage of application No. PCT/DE 02/03221, filed on 02 Sep. 2002.

This patent application claims the priority of German patent application 101 42 656.9, the disclosure content of which is hereby incorporated by reference.

FIELD OF THE INVENTION

The present invention relates to a process for producing semiconductor layers based on III-V nitride semiconductors, in particular low-defect semiconductor layers based on III-V nitride semiconductors.

BACKGROUND OF THE INVENTION

In the present context, the term III-V nitride semiconductors encompasses the materials derived from GaN or related to GaN as well as, for example, ternary or quaternary solid solutions based thereon. It encompasses in particular the materials AlN, InN, AlGaN ($Al_{1-x}Ga_xN$, $0 \leq x \leq 1$), InGaN $In_{1-x}Ga_xN$, $0 \leq x \leq 1$), InAlN ($In_{1-x}Al_xN$, $0 \leq x \leq 1$) and AlInGaN ($Al_{1-x-y}In_xGa_yN$, $0 \leq x \leq 1$, $0 \leq y \leq 1$).

In the text which follows, the term "III-V nitride semiconductors" relates to the above-described group of materials. Furthermore, this term comprises materials which are used to form buffer layers during the epitaxial production of layers belonging to the materials systems cited.

It is generally known that a semiconductor layer with few crystal defects can best be grown on a substrate with a lattice constant which is approximately equal to that of the semiconductor layer which is to be grown. However, a substrate material of this type which can be produced in particular at an economically viable level of technical effort is not available for semiconductor layers based on III-V nitride semiconductors (generally referred to below as III-V nitride semiconductor layer for short). Therefore, the only option at present is for semiconductor layers based on III-V nitride semiconductors to be grown on substrates such as sapphire, spinel or silicon carbide, but these materials generally have a different lattice constant than III-V nitride semiconductors.

If sapphire, SiC and similar substrates with different lattice constants are used, however, dislocations are formed in the epitaxy layer in a density of approximately $10^8$ to $10^{10}$ $cm^{-2}$. Charge carriers can recombine at such dislocations without emitting any radiation and are therefore no longer available, for example, for the generation of light in light-emitting diodes.

Therefore, it is already known from the prior art first of all to apply a buffer layer, for example of ZnO, to the substrate in order to reduce the difference in lattice constants between the III-V nitride semiconductor layer and the substrate. However, since the crystal properties of ZnO, for example on a sapphire substrate, are not of particularly good quality, it is consequently very difficult for a GaN semiconductor layer with good crystal properties to be grown on this ZnO buffer layer.

Therefore, by way of example, what is known as the ELOG process has been proposed for production of low-defect III-V nitride semiconductor layers. In this ELOG process, first of all a mask layer is applied to a substrate in order to form unmasked regions and masked regions on the substrate, the mask layer consisting of a material which substantially does not allow crystal growth of a semiconductor layer based on III-V nitride semiconductors. In a second step, a semiconductor layer based on III-V nitride semiconductors is grown epitaxially onto the unmasked regions of the substrate. As soon as the thickness of the III-V nitride semiconductor layer on the unmasked regions of the substrate exceeds the thickness of the mask layer, the III-V nitride semiconductor layer begins to grow together laterally over the masked regions until a completely continuous epitaxy layer has formed. Since the III-V nitride semiconductor layer therefore has mainly been formed not by growth on the substrate, but rather by lateral crystal growth, the continuous III-V nitride semiconductor layer has a significantly lower number of dislocations over the masked regions than over the unmasked regions of the substrate. The ELOG process can be used to produce III-V nitride semiconductor layers with a thickness of a few $\mu m$ and a relatively low dislocation density.

Examples of an ELOG process of this type are disclosed in U.S. Pat. Nos. 6,153,010 A1 and 6,225,650 B1, the subject matter of which is hereby incorporated by reference.

The ELOG process was originally developed for a sapphire substrate and therefore has drawbacks in particular with other substrate materials. If the coefficient of thermal expansion of the grown III-V nitride semiconductor layer is greater than that of the substrate, as is the case, for example, with the combination of $Al_xGa_{1-x}N$ on SiC, stress-induced cracks are formed in the epitaxy layer during the cooling phase from the growth temperature to room temperature, which may make the III-V nitride semiconductors unusable.

SUMMARY OF THE INVENTION

One object of the present invention is to provide an improved process for producing low-defect semiconductor layers based on III-V nitride semiconductors which leads to satisfactory results even if there are differences between the coefficient of thermal expansion of the grown III-V nitride semiconductor layer and that of the substrate, in particular if the coefficient of thermal expansion of the substrate is lower than that of the III-V nitride semiconductor layer which is to be grown.

This and other objects are attained in accordance with one aspect of the present invention which is directed to a process for producing a III-V nitride semiconductor layer wherein, a substrate made from a material which is not based on III-V nitride semiconductors is provided, and then a mask layer is applied to the substrate in order to form unmasked regions and masked regions on the substrate. The mask layer comprises a material which substantially does not allow crystal growth of the layer based on III-V nitride semiconductor material which is to be grown. Then, starting from the unmasked regions of the substrate, the III-V nitride semiconductor layer is grown. To avoid the formation of stress-induced cracks during the cooling phase from the growth temperature to the room temperature, the mask layer is formed on the substrate in such a manner that some of the masked regions are designed to be sufficiently wide to prevent the III-V nitride semiconductor layer from growing together over these wide masked regions, whereas the III-V nitride semiconductor layer does grow together only over the other, narrow masked regions. This measure leads to the formation of separate regions of III-V nitride semiconductor layers, with the result that these III-V nitride semiconductor layers, during the phase of cooling to room temperature, have a degree of freedom allowing them to contract in the lateral direction without forming stress-induced cracks, even if the III-V nitride semiconductor layer has a different coefficient of thermal expansion than the substrate.

In a preferred embodiment, the mask layer comprises strip-like masked regions which are separated from one another by strip-like unmasked regions.

The ratio of the number of narrow masked regions to the number of wide masked regions is preferably approximately between 1:1 and 1:4, i.e., by way of example, every second to fifth, particularly preferably every third masked strip is designed as a wide strip.

The ratio of the width of the wide masked regions to the width of the narrow masked regions is advantageously greater than approximately 2, particularly preferably greater than approximately 4.

The substrate may comprises sapphire, spinel or silicon carbide, and the mask layer comprises, for example, silicon oxide, silicon nitride, titanium oxide, zirconium oxide or a combination thereof.

The III-V nitride semiconductor layer is preferably grown onto the substrate by means of metal organic vapor phase epitaxy (MOVPE).

To further reduce the dislocation density in the grown III-V nitride semiconductor layer, it is possible for a buffer layer, for example of ZnO or of a nitride semiconductor material, to be applied to the substrate prior to the application of the mask layer.

BRIEF DESCRIPTION OF THE DRAWINGS

The present invention is explained in more detail below on the basis of a preferred exemplary embodiment and with reference to the drawing, in which the only FIGURE shows a cross-sectional view through a semiconductor structure which has been produced using the process according to the present invention.

DETAILED DESCRIPTION OF THE DRAWINGS

The process according to the invention is based on the ELOG process for producing low-defect III-V nitride semiconductor layers which was described in the introduction and has been modified in order to improve it. Consequently, there is no need for a detailed description of the process according to the invention, since it is possible to refer to the known principles of the ELOG process and of general semiconductor technology, as explained extensively, for example, in the abovementioned EP-A1-0 942 459.

As illustrated in the cross section presented in the FIGURE, the base used for the semiconductor layer 3 which is to be grown by epitaxy is a substrate 1 made from a material which is not based on III-V nitride semiconductors and has a lower coefficient of thermal expansion than the III-V nitride semiconductor material which is to be grown. The substrate used is, for example silicon carbide (SiC), although it is also possible, for example, to use ZnS substrates, GaAs substrates, spinel ($MgAl_2O_4$) substrates or Si substrates.

An additional buffer layer (not shown), which reduces the difference in lattice constants between the III-V nitride semiconductor layer which is to be grown and the substrate, may optionally be applied to this substrate 1. An example of a suitable buffer layer of this type is a ZnO layer, a MgO layer or a III-V nitride semiconductor layer (AlN, GaN, AlGaN, InGaN) which has not been produced by means of the process described here. In principle, however, the process according to the present invention can also be carried out with the desired results without using a buffer layer of this type.

Then, first of all a mask layer 2 is applied to the substrate 1 or to the buffer layer on the substrate 1. As can be seen clearly from the cross-sectional view, this mask layer comprises masked regions 2a and 2b and unmasked regions 2c between the masked regions 2a, 2b. It is preferable for both the masked regions and the unmasked regions 2a, 2b and 2c of the mask layer 2 to be designed in strip form. Alternatively, however, lattice structures and the like are also possible. According to the present invention, some of the masked strips are designed as narrow strips 2a, and others as wide strips 2b. The ratio of the width Wb of the wide strips 2b to the width Ws of the narrow strips 2a is preferably greater than 2, particularly preferably greater than 4. The optimum ratio of the widths Wb:Ws is in this case dependent in particular on the desired layer thickness $D_{HL}$ of the semiconductor layer 3 which is then to be grown. In the preferred exemplary embodiment of the invention illustrated, every third masked strip is designed as a wide strip 2b; depending on the particular application, it is preferable for every second to fifth strip to be formed as a wide strip 2b.

The width Ws of the narrow masked regions 2a is approximately 0.5 to 100 μm, particularly preferably approximately 5 to 20 μm; and the layer thickness $D_M$ of the mask layer 2 is approximately 0.01 to 5 μm, preferably 0.1 to 3 μm.

The material used for the mask layer 2 is selected in such a manner that growth of a III-V nitride semiconductor layer thereon is prevented or at least greatly restricted, so that the epitaxial growth of the III-V nitride semiconductor layer 3 proceeds only from the unmasked regions 2c of the substrate 1. Suitable materials for the mask layer 2 are in particular oxides and nitrides, such as for example silicon oxide ($SiO_x$), silicon nitride ($Si_xN_y$) titanium oxide ($TiO_x$) and zirconium oxide ($ZrO_x$), or a multilayer structure comprising these components. Moreover, the mask layer 2 must be able to withstand the temperatures of over 600° C. which are required for the growth of the semiconductor layer 3. Therefore, mask layers made from $SiO_2$, $SiN_x$ and $SiO_{1-x}N_x$ are particularly preferred. The mask layer 2 is applied by means of conventional techniques, such as for example evaporation coating, sputtering or CVD followed by the desired unmasked regions 2c being etched away.

Then, a GaN semiconductor layer is epitaxially grown onto the substrate 1 which has been provided with the mask layer 2. In the context of the present exemplary embodiment, a GaN semiconductor is to be understood as meaning a semiconductor material of formula $In_xGa_yAl_zN$, where $0 \leq x \leq 1$, $0 < y \leq 1$, $0 \leq z \leq 1$ and x+y+z=1.

The GaN semiconductor layer can be grown by any desired process for growing GaN semiconductor layers. Examples of suitable techniques are metal organic vapor phase epitaxy (MOVPE), molecular beam epitaxy (MBE), halide vapor phase epitaxy (HVPE) or a combination of these known processes. Whereas the MOVPE process is preferable for relatively thin semiconductor layers, HVPE tends to be suitable for thicker semiconductor layers. Since these processes are already well known, there is no need for them to be described in detail here.

Since the masked regions 2a and 2b of the mask layer 2, on account of the choice of materials for the mask layer 2, prevent epitaxial growth of the GaN semiconductor layer, or at least make it much more difficult, the epitaxial growth of the GaN semiconductor layer 3 proceeds exclusively or at least predominantly from the unmasked regions 2c of the substrate 1, as illustrated in the FIGURE. Only once the layer thickness of the grown semiconductor layer 3 exceeds the layer thickness of the mask layer 2 does the growth of the GaN semiconductor layer 3 also begin to take place over the masked regions 2a and 2b of the mask layer, in this case at least predominantly in the lateral direction.

Since the GaN semiconductor layer 3, as in the known ELOG processes, therefore, is substantially not formed by growth on the substrate 1, but rather by lateral crystal growth, the continuous GaN semiconductor layer 3 has a significantly reduced number of dislocations 5 over the masked regions 2a and 2b than over the unmasked regions 2c of the substrate 1. Consequently, it is possible to produce GaN semiconductor layers which are a few μm thick and have a relatively low dislocation density 5.

Since, however, in the process according to the present invention, unlike in the conventional ELOG processes, the mask layer 2 also includes wide masked regions 2b, the GaN semiconductor layer does not completely grow together. More accurately, the GaN semiconductor layer grows together only over the narrow masked regions 2a, whereas a space 4 remains over the wide masked regions 2b, separating adjacent sections of the GaN semiconductor layer 3 from one another.

The ratio of the widths of the narrow masked regions 2a and the wide masked regions 2b and the ratio of the number of narrow masked regions 2a and wide masked regions 2b may be set variably depending on the desired layer thickness $D_{HL}$ and desired lateral extent $W_{HL}$ of the GaN semiconductor layer 3.

On account of the spaces 4 between adjacent regions of the grown GaN semiconductor layer 3 and the associated degree of freedom in the lateral direction, these individual regions may contract in the lateral direction during the cooling phase from the growth temperature to room temperature without stress-induced cracks being produced in the semiconductor layers 3 if the coefficient of thermal expansion of the substrate 1 is lower than that of the GaN semiconductor layer 3. This is the case, for example, with a $Al_xGa_{1-x}N$ layer 3 on an SiC substrate 1. In the opposite case, i.e. if the coefficient of thermal expansion of the substrate 1 is greater than that of the grown semiconductor layer 3, stresses which could lead to defective GaN semiconductor layers likewise do not occur in the semiconductor layer 3. This situation arises, for example, in the case of an $Al_xGa_{1-x}N$ layer 3 on a sapphire substrate 1.

Therefore, the process according to the present invention, in the case of masked and unmasked regions, designed in strip form, of the mask layer 2 makes it possible to produce strips of a semiconductor layer 3 with a low dislocation density which are of any desired length and, for example, approximately 20 to 50 μm wide.

The process according to the present invention can also be combined with the conventional ELOG process techniques. For example, in EP-A2-0 874 405 it is proposed first of all for a first mask layer to be applied to a substrate and then for a first GaN semiconductor layer to be grown thereon. This first GaN semiconductor layer then serves as a base, to which a second mask layer, which is arranged offset with respect to the first mask layer, and then the actual GaN semiconductor layer are applied. This further reduces the number of dislocations which are still present in the first semiconductor layer which is grown. In this case it is conceivable, for example, for the second mask layer and the second GaN semiconductor layer to be applied using the process of the present invention in order for the advantages of the two embodiments to be combined with one another.

The extent of protection of the invention and the invention itself are not restricted by the description of the invention on the basis of the exemplary embodiments. Rather, the invention includes any novel feature and any combination of features, which comprises in particular any combination of features in the patent claims and combinations of patent claims, even if these combinations are not explicitly specified in the patent claims.

What is claimed is:

1. A process for producing a III-V nitride semiconductor layer (3), in particular based on GaN, comprising:
    a) providing a substrate (1) made from a material which is not based on III-V nitride semiconductors;
    b) applying a mask layer (2) to the substrate (1) in order to form unmasked regions (2c) and masked regions (2a, 2b) on the substrate, the mask layer comprising a material which substantially does not allow crystal growth of a III-V nitride semiconductor layer; and
    c) growing a III-V nitride semiconductor layer (3) starting from the unmasked regions (2c) of the substrate (1), wherein the mask layer (2) is formed on the substrate (1) in such a manner that some of the masked regions (2b) are so wide that in step c) the III-V nitride semiconductor layer (3) is prevented from growing together over these wide masked regions (2b), whereas the III-V nitride semiconductor layer does grow together over the other, narrow masked regions (2a).

2. The process as claimed in claim 1, wherein the coefficient of thermal expansion of the substrate (1) is lower than that of the III-V nitride semiconductor layer which is to be grown.

3. The process as claimed in claim 1, wherein the mask layer (2) comprises strip-like masked regions (2a, 2b) which are separated (4) from one another by strip-like unmasked regions (2c).

4. The process as claimed in claim 1, wherein the ratio of the number of narrow masked regions (2a) to the number of wide masked regions (2b) is approximately between 1:1 and 1:4.

5. The process as claimed in claim 1, wherein the ratio of the width (Wb) of the wide masked regions (2b) to the width (Ws) of the narrow masked regions (2a) is greater than approximately 2.

6. The process as claimed in claim 4, wherein the ratio of the width (Wb) of the wide masked regions (2b) to the width (Ws) of the narrow masked regions (2a) is greater than approximately 4.

7. The process as claimed in claim 1, wherein the width (Ws) of the narrow masked regions (2a) is approximately 0.5 to 100 μm.

8. The process as claimed in claim 1, wherein the substrate (1) comprises sapphire, spinel or silicon carbide.

9. The process as claimed in claim 1, wherein the mask layer (2) comprises silicon oxide, silicon nitride, titanium oxide, zirconium oxide or a combination thereof.

10. The process as claimed in claim 1, wherein the thickness of the mask layer (2) is approximately 0.01 to 5 μm.

11. The process as claimed in claim 1, wherein the growth of the III-V nitride semiconductor layer (3) in step c) is carried out by means of metal organic vapor phase epitaxy (MOVPE).

12. The process as claimed in claim 1, wherein a buffer layer is applied to the substrate (1) prior to the application of the mask layer (2) in step b).

13. The process as claimed in claim 12, wherein the buffer layer consists of ZnO or of a nitride semiconductor layer.

* * * * *